United States Patent
Black et al.

(10) Patent No.: US 10,804,851 B2
(45) Date of Patent: Oct. 13, 2020

(54) SYSTEMS AND METHODS FOR A CURRENT SENSE AMPLIFIER COMPRISING A SAMPLE AND HOLD CIRCUIT

(71) Applicant: Maxim Integrated Products, Inc., San Jose, CA (US)

(72) Inventors: Daniel J. Black, Tempe, AZ (US); Antoine D. Fifield, Mesa, AZ (US); Brian A. Miller, Gilbert, AZ (US)

(73) Assignee: Maxim Integrated Products, Inc., San Jose, CA (US)

( * ) Notice: Subject to any disclaimer, the term of this patent is extended or adjusted under 35 U.S.C. 154(b) by 16 days.

(21) Appl. No.: 16/366,832

(22) Filed: Mar. 27, 2019

(65) Prior Publication Data

US 2019/0312549 A1    Oct. 10, 2019

Related U.S. Application Data

(60) Provisional application No. 62/652,753, filed on Apr. 4, 2018.

(51) Int. Cl.
*H03F 1/02* (2006.01)
*G11C 27/02* (2006.01)
*H03F 3/45* (2006.01)
*G01R 19/00* (2006.01)

(52) U.S. Cl.
CPC .......... *H03F 1/02* (2013.01); *G01R 19/0023* (2013.01); *G11C 27/026* (2013.01); *H03F 3/45* (2013.01); *H03F 2203/45151* (2013.01); *H03F 2203/45156* (2013.01); *H03F 2203/45526* (2013.01)

(58) Field of Classification Search
CPC ........................................................ H03F 1/02
See application file for complete search history.

(56) References Cited

U.S. PATENT DOCUMENTS

| | | | | |
|---|---|---|---|---|
| 5,101,174 A | * | 3/1992 | Hynecek | H03F 3/70 257/239 |
| 5,180,932 A | * | 1/1993 | Bengel | G11C 27/026 327/362 |
| 5,351,005 A | * | 9/1994 | Rouse | G01R 17/10 324/207.21 |
| 7,113,004 B2 | * | 9/2006 | Terzioglu | G11C 7/06 327/51 |
| 7,724,596 B1 | * | 5/2010 | Sutardja | G11C 7/062 327/51 |
| 2003/0058768 A1 | * | 3/2003 | Yokoyama | G11B 7/0941 369/53.18 |
| 2011/0001492 A1 | * | 1/2011 | Nys | H03M 1/123 324/658 |

* cited by examiner

*Primary Examiner* — Patricia T Nguyen
(74) *Attorney, Agent, or Firm* — North Weber and Baugh LLP; Michael North

(57) ABSTRACT

Described herein are systems and methods that reduce settling time in amplifier circuits, such as voltage sense amplifiers (VSA) or current sense amplifiers (CSA) circuits, that comprise a feedback path. When the feedback path is interrupted via a switch, a CSA circuit switches to open loop. A sample-and-hold circuit holds the output voltage of the amplifier, such that when a load is connected to the CSA circuit, the open loop settling time, which is shorter than the closed loop settling time, is allowed to pass before the CSA output voltage is measured, thereby, advantageously preventing any potential disturbance present at the CSA output from being fed back to the CSA input.

20 Claims, 6 Drawing Sheets

SYSTEMS AND METHODS FOR A CURRENT SENSE AMPLIFIER COMPRISING A SAMPLE AND HOLD CIRCUIT

CROSS-REFERENCE TO RELATED APPLICATION

This patent application is related to and claims priority benefit under 35 U.S.C. § 119(e) to commonly-owned U.S. Provisional Patent Application No. 62/652,753, entitled "SYSTEMS AND METHODS FOR A CURRENT SENSE AMPLIFIER COMPRISING A SAMPLE AND HOLD CIRCUIT," naming as inventors Daniel J. Black, Antoine D. Fifield, and Brian A. Miller, and filed Apr. 4, 2018, which patent document is incorporated by reference herein in its entirety and for all purposes.

A. TECHNICAL FIELD

The present disclosure relates generally to electrical circuits. More particularly, the present disclosure relates to systems and methods for sensing voltage or current in electrical circuits, such as in a stack of battery cells, by using a current sense amplifier (CSA) or voltage sense amplifier (VSA).

B. BACKGROUND

In many high-voltage battery applications, a CSA circuit is used as part of a safety measurement to measure the charging and discharging current of a stack of battery cells. Typically, the CSA circuit uses a shunt resistor to detect a voltage from which a corresponding charging or discharging current is then derived. FIG. 1 illustrates such a conventional current sense amplifier circuit. Circuit 100 comprises cells 102, sense resistor 104 that is connected to analog ground 120, and amplifier 106 that has a feedback capacitor 110. As depicted in FIG. 1, amplifier 106 can be connected to ADC 108 that represents a load at the output of amplifier 106. Amplifier 106 usually enables voltage sampling at its output without having "seen" or having accounted for the load, here, ADC 108.

As one of skill in the art will appreciate that once the input of amplifier 106 changes, its output will change after some time delay. This delay is partially caused by the presence of feedback capacitor 110, which represents either some intentionally included or inherent (i.e., parasitic) capacitance in circuit 100. Sense resistor 104 feeds into amplifier 106 and generally provides a relatively small voltage signal for the input of amplifier 106 that then amplifies that signal to some practical level that can be measured. Since amplifier 106 has to have a relatively large gain to provide sufficient amplification for the small signal, undesirable noise at the front-end will also be amplified.

Certain approaches that are intended to limit noise amplification operate at the expense of limiting the overall bandwidth of amplifier 106, e.g., by intentionally slowing down the operation of circuit 100 at higher gain levels and waiting for the output of amplifier 106 to settle before measuring the output voltage. However, the settling time of amplifier 106 is at least an order of magnitude greater that the sampling time that ADC 108 requires to sample the output voltage of amplifier 106. Once ADC 108, which typically is a capacitive load, is connected to the output of circuit 100, e.g., through a load switch (not shown in FIG. 1), a capacitive discharge from the capacitive load is propagated to the input of amplifier 106, e.g., via feedback capacitor 110. As a result, charge that flows through the feedback path causes a signal perturbation that propagates throughout circuit 100 to the input of amplifier 106 and forces the output of amplifier 106 to have to re-settle in some finite amount of time after ADC 108 is connected.

In other words, once ADC 108 is connected, the feedback loop around amplifier 106 enables a disturbance at the amplifier output to feed back to the amplifier input, thereby, necessitating a settling time for amplifier 106 that is significantly longer than the time ADC 108 needs to perform a voltage measurement. In addition, if the ADC 108 is a dual use or multiplexed ADC that is time-multiplexed between multiple different measurement inputs (not shown in FIG. 1), i.e., if ADC 108 is, as is oftentimes the case, not a dedicated ADC, it may not be available, for a relatively long time, to sample the output of amplifier 106.

Accordingly, what is needed are systems and methods that overcome the shortcoming of existing approaches.

SUMMARY

Embodiments of the present application provide current sense amplifier systems and methods that reduce settling time In aspects of the application, a method for operating a current sense amplifier comprises: in a settling phase, operating a CSA circuit comprising a feedback path to allow for a closed loop settling time to pass to settle, at an output node, an output voltage; in a sample and hold phase, breaking the feedback path, e.g., buy opening a switch, and operating the CSA in an open loop configuration; holding the output voltage using a sample and hold circuit; coupling a load to the output node; and allowing for an open loop settling time to pass to reduce a sensitivity to changes in an input or an output of the CSA, the open loop settling time being shorter than the closed settling time.

In aspects of the application, the CSA may be implemented as a differential current-feedback instrumentation amplifier that provides isolation between input and output common mode levels. The CSA may comprise: an amplifier coupled to an input of the CSA; an output buffer coupled to the amplifier, the output buffer does not bandwidth-limit signals and drives a load to a settled value regardless of the input of the CSA, thereby, decreasing a settling time of the CSA that is determined by the open loop gain of the output buffer; an output switch coupled to the output buffer, the output switch configured to couple to a load; a sample-and-hold circuit coupled to (e.g., integrated with) the amplifier and the output buffer, the sample-and-hold circuit configured to hold an input voltage of the output buffer and prevent a current that is fed back from an output of the CSA to the input of the CSA from reaching the output buffer when the load is coupled to the CSA; and a feedback loop comprising feedback capacitor, the feedback loop being broken in a sample and hold phase so as to operate the CSA in an open loop configuration to reduce a sensitivity to changes in an input or an output of the CSA. The CSA may comprise a multi-cascaded gain topology comprising a Miller capacitor or a Nested-Miller capacitance to reduce oscillations, wherein at least one of the Miller capacitor or the Nested-Miller capacitance separates frequencies of poles of a feedback network to increase circuit stability, and wherein the sample-and-hold circuit comprises an inter-stage switch that, in a settling phase, enables a feedback path between an input stage and an output stage to allow an output voltage to settle.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF EMBODIMENTS

Figure 1:
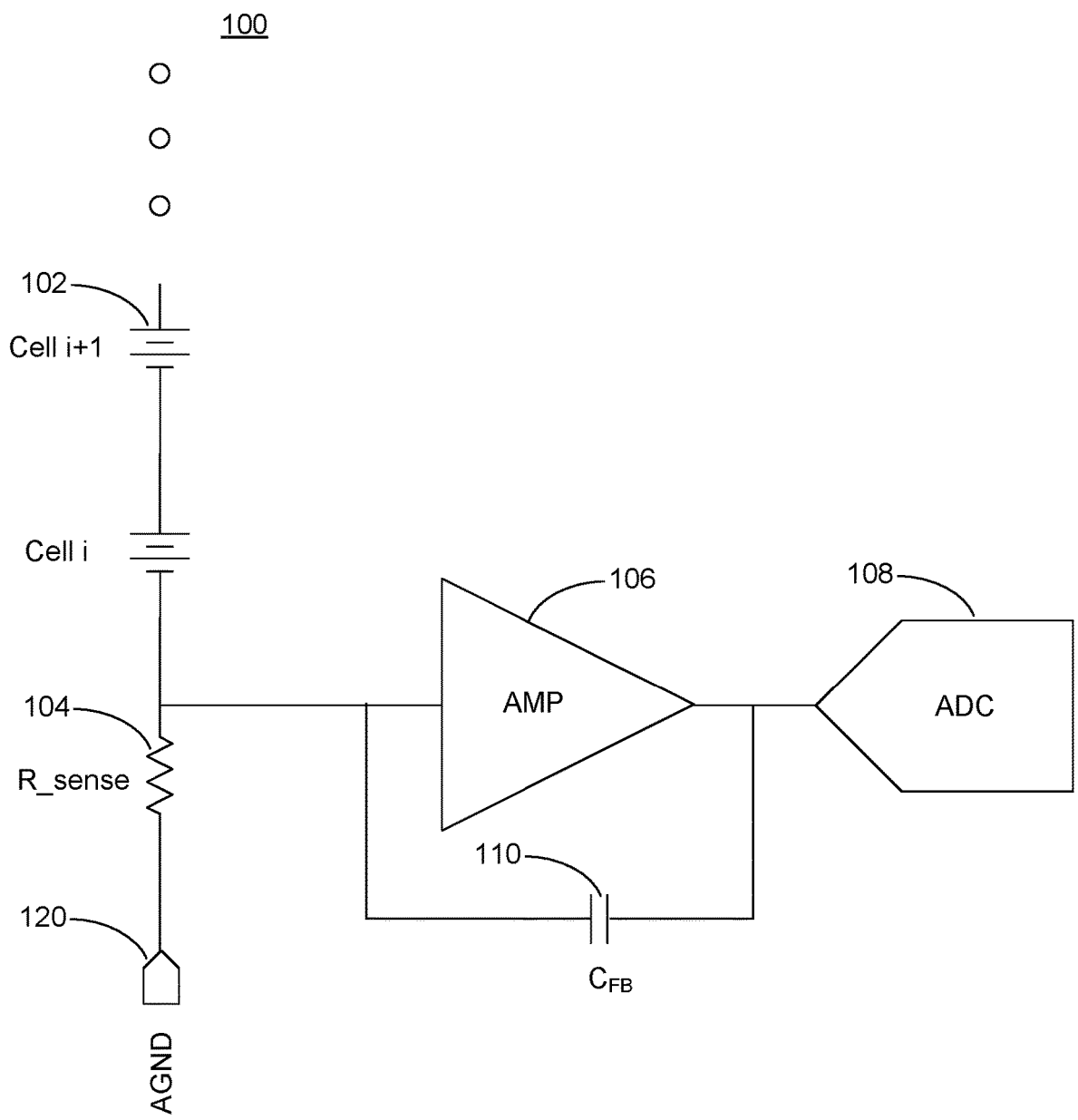
FIG. 1 illustrates a circuit using a conventional measurement system using a current sense amplifier (CSA) circuit.

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated. Furthermore, the use of memory, database, information base, data store, tables, hardware, and the like may be used herein to refer to system component or components into which information may be entered or otherwise recorded.

Furthermore, it shall be noted that: (1) certain steps may optionally be performed; (2) steps may not be limited to the specific order set forth herein; (3) certain steps may be performed in different orders; and (4) certain steps may be done concurrently.

Although the discussion in this document is mainly focused on current sense amplifiers, one of skill in the art will appreciate, that embodiments of the present disclosure are equally applicable to and may be implemented as a VSA.

Figure 2:
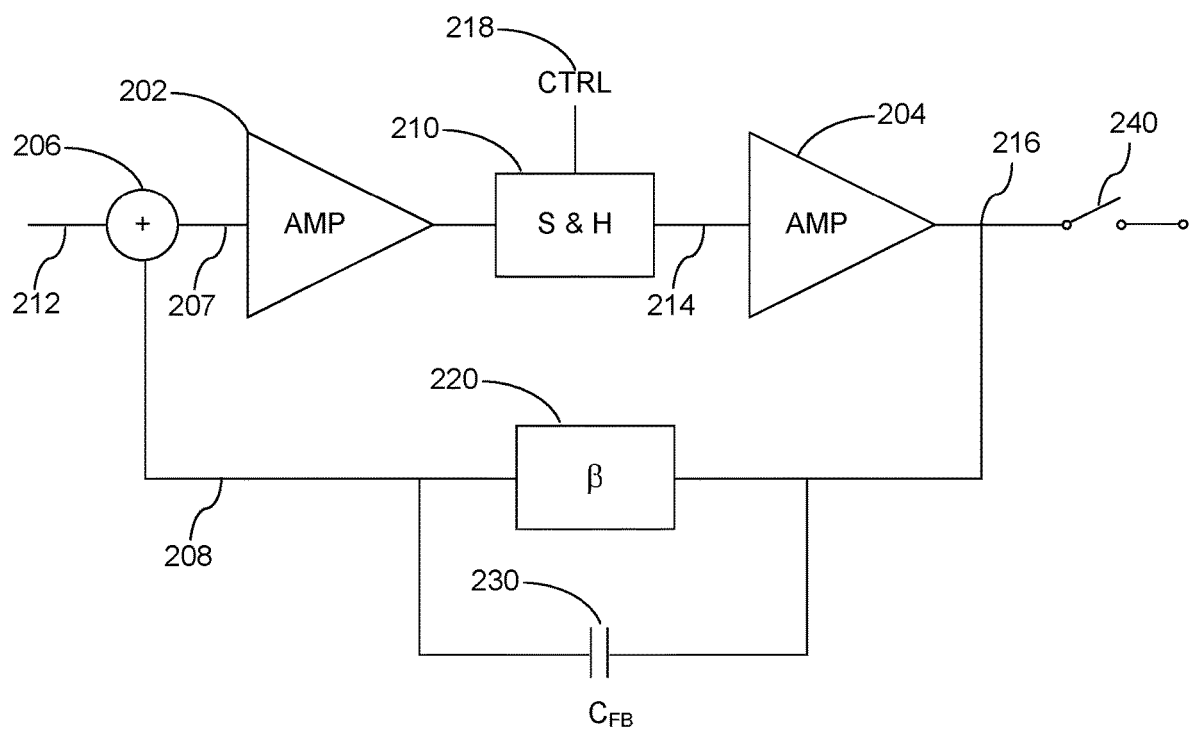
FIG. 2 illustrates a CSA topology comprising a sample and hold circuit according to embodiments of the present disclosure.

FIG. 2 illustrates a CSA topology comprising a sample and hold circuit according to embodiments of the present disclosure. CSA 200 comprises input 212, amplifier 202, sample-and-hold circuit 210, amplifier or output buffer 204, output 216, output switch 240, and feedback loop 208 that has a feedback network 220 that comprises feedback factor (labeled "β" in FIG. 2) and feedback capacitance 230.

It is understood that various components in circuit 200, e.g., sample-and-hold circuit 210, may be implemented with discrete components, such as a hold switch and a hold capacitor, and may be controlled via one or more control signals, such as a switch control signal. In embodiments, output switch 240 is a load switch that is part of a multiplexer (see, e.g., FIG. 5) that couples a number of inputs (e.g., 206) to an ADC (not shown in FIG. 2).

Feedback factor 220 is chosen such that the combination of feedback factor 220 and summing junction 206 represents a resistive divider comprising an internal node that may be coupled to input 207 of amplifier 202. The ratio of the resistors in the resistive divider may determine a gain such that input 212 obtains a value that is a fraction of output 216.

It is noted that amplifiers 202, 204, may or may not correspond to two different stages of CSA 200. Although the topology of CSA 200 is depicted as a two-stage architecture with amplifier 202 and amplifier 204 depicted as individual amplifier stages, a person of skill in the art will appreciate that circuit 200 may be implemented using any number of amplifier stages. For example, in embodiments, circuit 200 may be implemented by using a single amplifier stage that comprises sample-and-hold circuit 210, or by employing one amplifier stage for offset cancellation and another amplifier stage that to perform the functions of sample-and-hold circuit 210. In embodiments, circuit 200 comprises a single stage, such that reconfiguring the output of that stage allows for a relatively rapid settling time. Sample-and-hold circuit 210 may be implemented as part of amplifier 202 or amplifier 204, e.g., as part of the final output stage of amplifier 204.

In embodiments, e.g., in a settling phase in a normal mode of operation, CSA 200 may operate in a closed loop configuration, such that output 216 of circuit 200 may settle to an output voltage with a closed loop settling time, i.e., output 216 reaches a desirable value. Then, in embodiments, in a sample-and-hold phase just prior to engaging a load, such as an ADC (not shown in FIG. 2) that has an input capacitance that introduces a load change, circuit 200 may be operated in an open loop configuration utilizing sample-and-hold circuit 210 to hold (i.e., store or buffer) the voltage at input 214 of amplifier 204 and disconnect amplifier 202 from amplifier 204, such as to cut feedback loop 208 that would otherwise couple output 216 back to input 212.

In embodiments, this may be accomplished, e.g., by opening a switch (not shown in FIG. 2) located between amplifier 202 and 204. Thus, once a load is coupled to CSA 200, sample-and-hold circuit 210 prevents a kickback by that load from disturbing the value of the voltage at output 216 of CSA 200. As a result, the load is driven with the buffered voltage at output 216, such that a perturbation caused by virtue of, e.g., a capacitive load being coupled to CSA 200, relatively quickly recovers due to the fact that the perturbation no longer has a path to loop through circuit 200 to reach the input of amplifier 204.

In embodiments, output buffer 204 drives the load to a settled value regardless of input 212 and serves as an intermediate point beyond which the signal passing through output buffer 204 is no longer bandwidth restricted. This allows for a faster settling time since the open loop gain of output buffer 204 will determine the settling time instead of the closed loop bandwidth(s) associated with CSA 200. As a result, a perturbation caused by the load will have a significantly reduced effect on CSA 200, resulting in a significantly reduced settling time.

A person of skill in the art will appreciate that the principles disclosed herein are also applicable to various topologies. For example, as illustrated in FIG. 3, the single-ended CSA 200 depicted in FIG. 2 may equally be implemented in a differential design.

Figure 3:
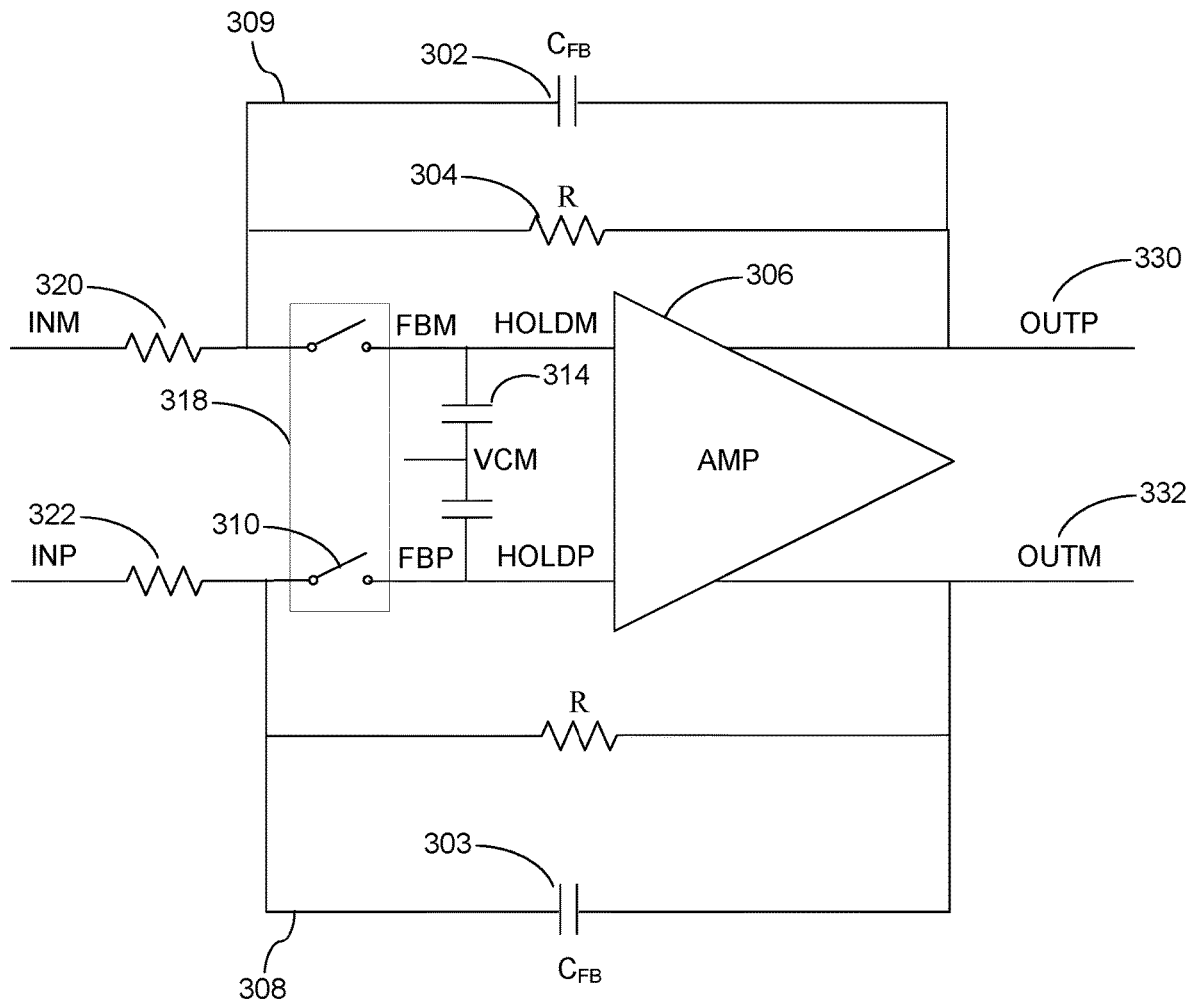
FIG. 3 illustrates an exemplary differential CSA circuit comprising a sample and hold circuit according to embodiments of the present disclosure.
Figure 4:
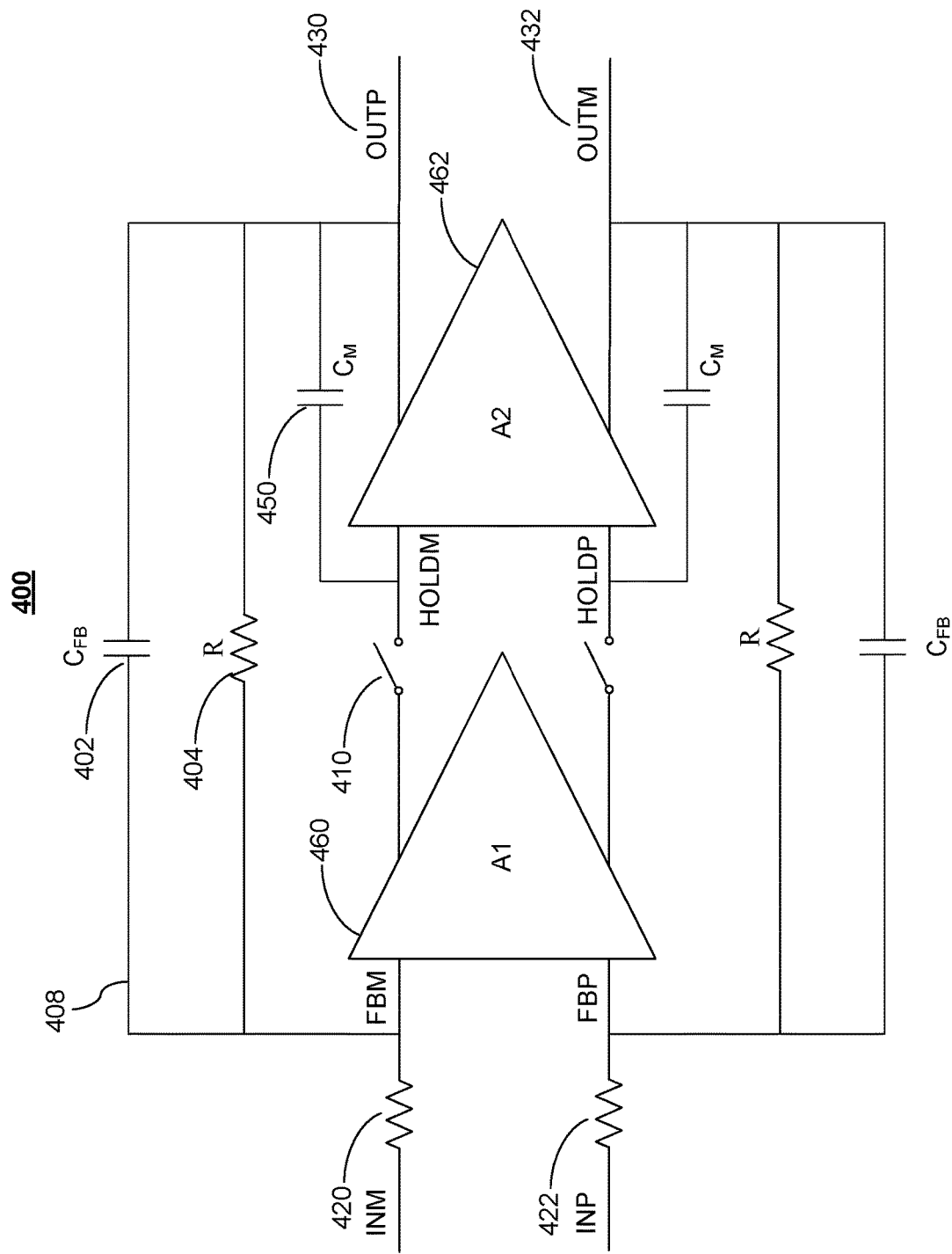
FIG. 4 illustrates an exemplary multi-stage differential CSA comprising a sample and hold circuit according to embodiments of the present disclosure.

In embodiments, as shown in FIG. 3 and FIG. 4, the architecture of the CSA may comprise one or more differential gain stages, the gain of the CSA may be selectable, e.g., by adjusting the resistance values of resistors 304, 305 in feedback loop 308, 309 around amplifier 306. As depicted, FIG. 3 illustrates an exemplary differential CSA topology comprising a sample and hold circuit according to embodiments of the present disclosure. CSA 300 comprises input resistors 320, 322, amplifier 306, sample-and-hold circuit 318, output 330, 332, and feedback loop 308, 309 that comprises feedback capacitance 302, 303 and feedback resistor 302, 304.

As with the single-ended architecture shown in FIG. 2, by switching from a closed loop phase to an open loop phase, sample-and-hold circuit 318 in circuit 300 electrically decouples feedback loop 308, 309 to prevent charge from output 330, 332 being fed back to amplifier inputs HOLDM and HOLDP in a manner that may negatively affect a voltage reading at output 330, 332. In embodiments, even if charge from output 330, 332 may reach input 320, 322, i.e., via feedback capacitor 302, 303, the corresponding signal is nevertheless prevented from looping back to output 330, 332 when CSA 300 is connected to a load.

In embodiments, during an auto-zero phase, the inputs of amplifier 306 may be electrically shorted, to enable an offset measurement that measures and/or cancels an offset voltage. In embodiments, the offset voltage may be sampled prior to the settling phase that, e.g., couples input 320, 322 to output 330, 332, and allows output 330, 332 to settle. In embodiments, auto-zeroing may be implemented into one or more stages of circuit 200, e.g., to cancel an input offset of an amplifier such as to prevent an offset voltage from being multiplied by the gain of each amplifier stage that, otherwise, may cause significant measurement errors.

A person of skill in the art will appreciate that auto-zeroing and other offset cancellation techniques have the added benefit that a substantial amount of 1/f noise may be removed (i.e., suppressed or cancelled) from CSA 200. For example, 1/f noise may be reduced by chopping techniques, e.g., by utilizing a suitable low-jitter, fixed pulse-width clock (not shown in FIG. 1).

FIG. 4 illustrates an exemplary multi-stage differential CSA topology comprising a sample and hold circuit according to embodiments of the present disclosure. For clarity, components similar to those shown in FIG. 3 are labeled in a similar manner. For purposes of brevity, a description of their function is not repeated here.

It is understood that stages 460, 462 in FIG. 4 may have input common modes that are decoupled from the output common modes. Each stage 460, 462 may have its own offset cancellation. The CSA cascaded to create multiple gain stages that may each have their own offset cancellation and programmable gain that, in embodiments, may be individually chosen. Gain settings may be adjusted, for example, by varying a feedback network comprising resistor 404.

In embodiments, an individual instance of multi-stage differential CSA 400 may be implemented as a current-feedback instrumentation amplifier that advantageously provides isolation between input and output common mode levels. However, this is not intended as a limitation on the scope of the present disclosure since CSA 400 may be implemented using any combination of single and multi-stage amplifiers. Amplifiers may be of any type known in the art, e.g., current-feedback instrumentation amplifiers, common inverting amplifiers, or alternate amplifier architectures.

In embodiments, for amplifiers with multiple gain stages (e.g. 460, 462) Miller Compensation or Nested Miller Compensation may be employed to achieve circuit stability. In embodiments, when a multi-cascaded gain topology comprising a feedback loop (e.g., feedback loop 408 comprising feedback capacitor 402 and resistor 404) is utilized, a hold capacitor (e.g., 450) may be used (or reused) in a Miller capacitor compensation circuit or as a Nested-Miller capacitance. For example, capacitor 450 at output 430, 432 may provide stability for circuit 400 by separating the frequencies of the poles of the feedback network, thereby, preventing unwanted oscillations.

In embodiments, switch 410 in circuit 400 may be an interstage switch that serves as part of a sample and hold circuit. In embodiments, switch 410, e.g., in a settling phase, enables feedback loop 408, thereby, coupling input stage 460 to output stage 462 to allow the voltage at output 430, 432 to settle to a certain value. Advantageously, this may be accomplished, for example, while circuit 400 is waiting for an ADC at output 430, 432 to become available for a voltage measurement.

In embodiments, during a settle-and-hold phase, once switch 410 is opened and feedback loop 408 is disabled, the voltage value at the input of amplifier 462 may be held by capacitor 450, e.g., a compensation/Miller capacitor designed provide stability for circuit 400. In embodiments, capacitor 450, may hold/sample the output voltage at an intermediate node (labeled HOLDM and HOLDP in FIG. 4) at the input of output stage 462. Advantageously, the captured value held on capacitor 450 allows circuit 400 to ignore event occurring at input 420, 422. As a result, when, e.g., an output multiplexer switch (not shown) is closed to connect output 430, 432 to an ADC, the value at output 430, 432 will depend mainly on the input of amplifier 462, and not events that may occur on input 420, 422 of amplifier 460.

In other words, events that may possibly corrupt input 420, 422 need not be resettled as they do not affect the value held on nodes HOLDM and HOLDP, and output 430, 432 may thus recover significantly faster to a known value, i.e., a value stored by capacitor 450 rather than some corrupted value that may require a long resettling time. Overall, as a result of the sample and hold circuit cutting feedback path 408, amplifier 462 will recover from a perturbation to the held value with a much faster recovery time, since circuit 400 is no longer limited by the time constant of the feedback network 408.

Figure 5:
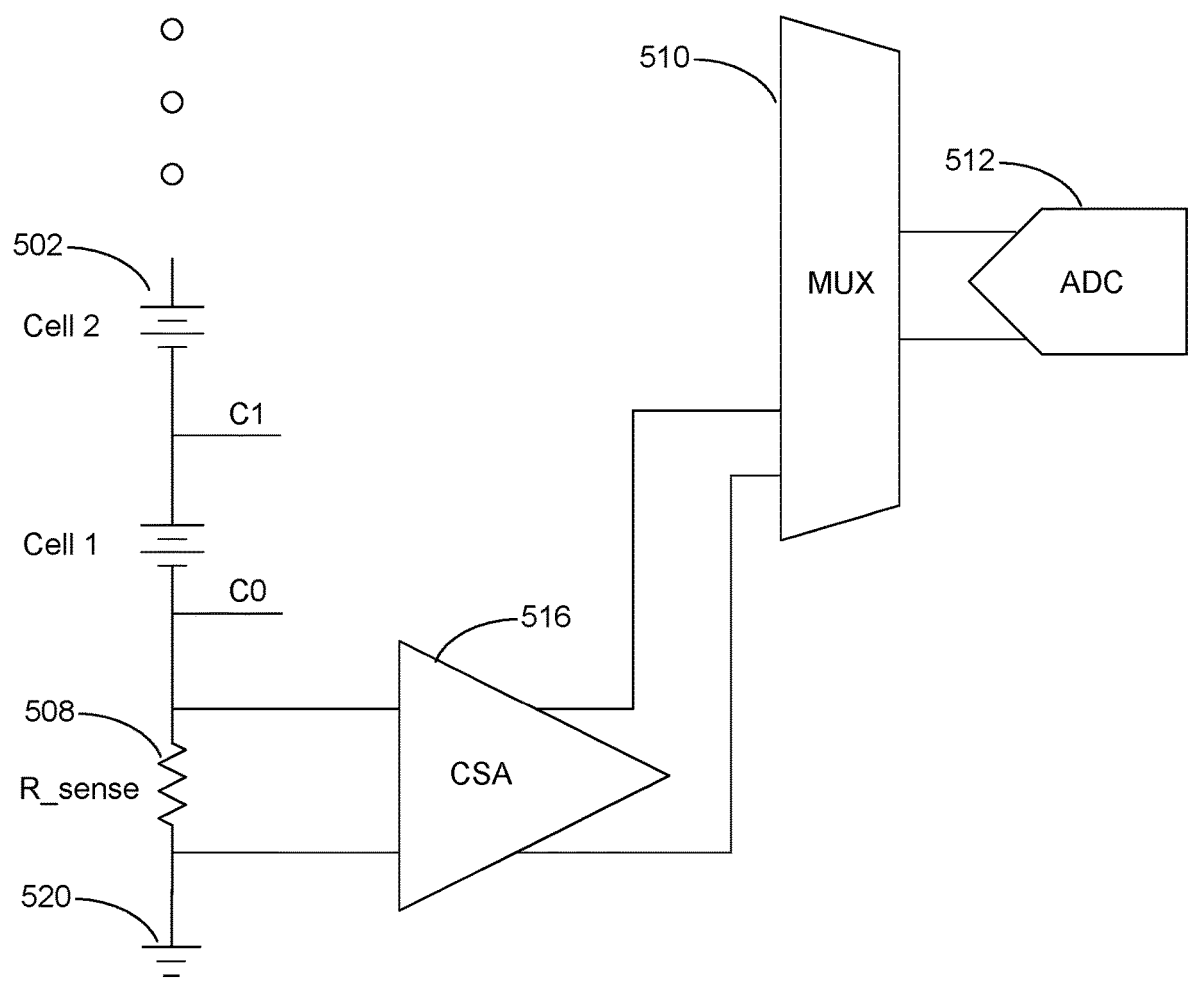
FIG. 5 illustrates an example system comprising a CSA according to embodiments of the present disclosure.

FIG. 5 illustrates an example system comprising a CSA according to embodiments of the present disclosure. System 500 comprises battery stack 502 that may comprise any number of battery cells, CSA 516, multiplexer 510, and ADC 512. In embodiments, multiplexer 510 is coupled between CSA 516 (e.g., a programmable gain amplifier) and ADC 512. Multiplexer 510 may have any number of inputs that receive signals from, e.g., a battery or diagnostic circuitry. In embodiments, multiplexer 510 may comprise one or more switches (e.g., embedded within multiplexer 510) that serve as output switches (not shown in FIG. 5) for CSA 516.

In embodiments, current sense resistor 508 may be implemented as a voltage sense resistor, e.g., coupled to a ground potential 520 on the low-voltage side of battery stack 502. In embodiments, system 500 comprises pins at the inputs of CSA 516 at which a charging or discharging current cells in battery stack 502 may be measured. Sense resistor 508 is a relatively small resistor (e.g., 50μΩ-100μΩ) that may be placed at the bottom of the battery stack 502, e.g., between the Cell 1 and ground potential 520.

In operation, battery stack 502 generates a charging or discharging current that may be detected by sense resistor 508. Sense resistor 508 produces a voltage equal to the resistance value of sense resistor 508 multiplied by the charging or discharging current. Once sense resistor 508 is coupled to the input(s) of CSA 516, CSA 516 may amplify the measured voltage by some gain, e.g., depending on a programmable setting, and output the amplified voltage to multiplexer 510. Multiplexer 510, in turn, passes the voltage to ADC 512 whose output voltage values may be further processed, e.g., stored, accessed, or read out as desired.

In embodiments, CSA 516 settles while ADC 512 is in engaged in measuring adjacent (or alternate) channels or inputs (e.g., via multiplexer 510). Then CSA 516 may couple to ADC 512 for a relatively short period of time, i.e., shorter than the settling time of CSA 516, such that ADC 512 can capture the voltage at the output of CSA 516 before moving on to the next ADC measurement. As previously discussed with reference to FIG. 2, when ADC 512 (i.e., a capacitive load) is coupled to CSA 516, the change in load impedance perturbs the input voltage to CSA 516 due to the presence of in some (inherent) feedback capacitance causing a settling time with a relative long time constant when compared to the time ADC 512 requires to perform a measurement on CSA 516. Various embodiments ensure that CSA 516 recovers from this perturbation within an acceptable recovery time.

Figure 6:
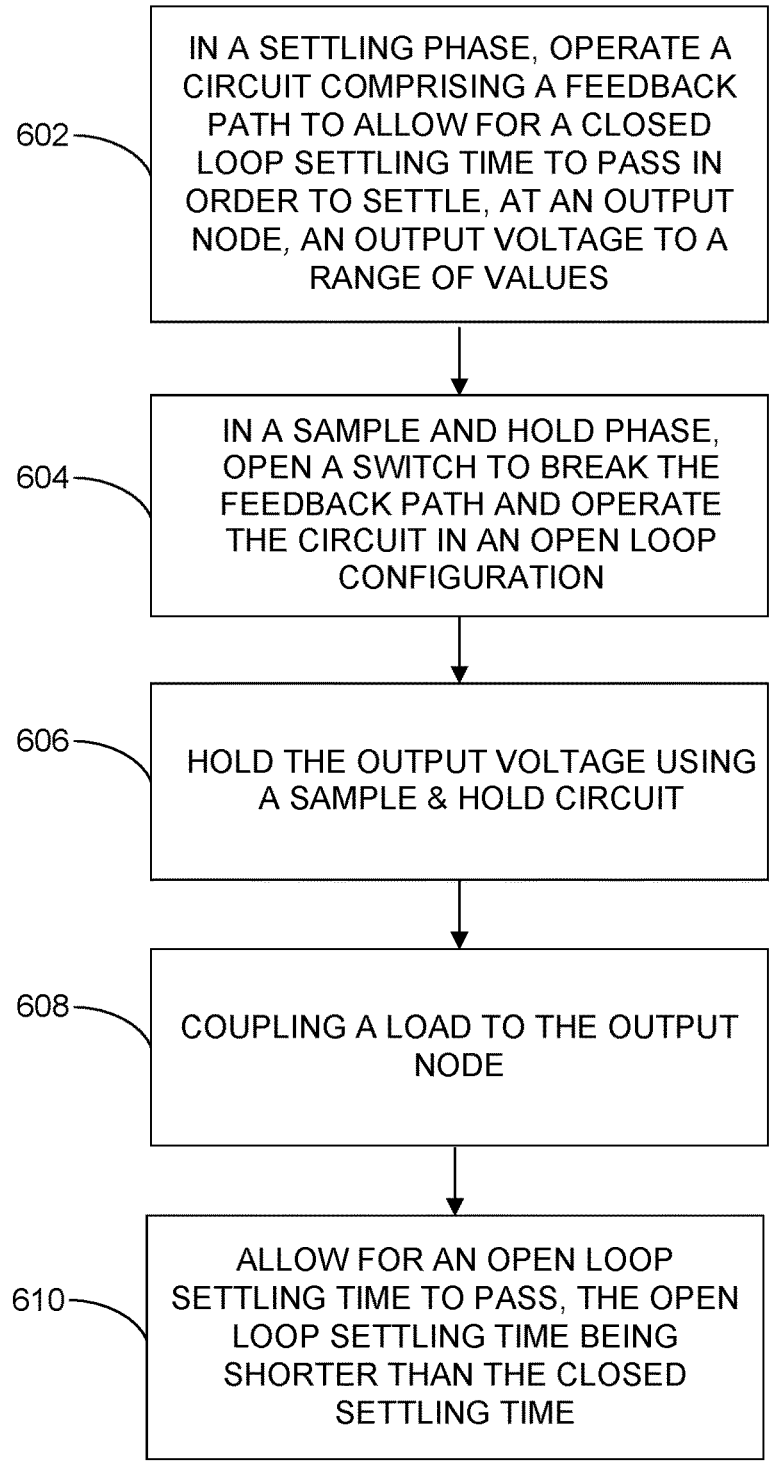
FIG. 6 is a flowchart for using a CSA according to embodiments of the present disclosure.

FIG. 6 is a flowchart for using a CSA according to embodiments of the present disclosure. Process 600 begins at step 602 when, e.g., in a settling phase, a CSA circuit comprising a feedback path is operated such as to allow for a closed loop settling time to pass in order to settle, at an output node, an output voltage to a range of values.

At step 604, e.g., in a sample-and-hold phase, a switch is opened such as to break the feedback path and operate the CSA circuit in an open loop configuration.

At step 606, the output voltage is held, e.g., by a sample and hold circuit.

At step 608, a load is coupled to the CSA circuit.

At step 610, an open loop settling time, which is shorter than the closed loop settling time, is allowed to pass, e.g., before the output voltage is measured at the output node.

One skilled in the art will recognize no computing system or programming language is critical to the practice of the present invention. One skilled in the art will also recognize that a number of the elements described above may be physically and/or functionally separated into sub-modules or combined.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

The invention claimed is:

1. A current sense amplifier (CSA) comprising:
an amplifier coupled to an input of the CSA;
an output buffer coupled to the amplifier;
a sample-and-hold circuit coupled to the amplifier and the output buffer, the sample-and-hold circuit configured to hold an input voltage of the output buffer; and
a feedback loop comprising a feedback network coupled to the output buffer, the feedback loop being broken in a sample and hold phase such as to operate the CSA in an open loop configuration to reduce a sensitivity to changes in an input or an output of the CSA.

2. The CSA according to claim 1, wherein the output buffer does not bandwidth restrict and drives a load to a settled value regardless of the input of the CSA, thereby, decreasing a settling time of the CSA.

3. The CSA according to claim 2, wherein an open loop gain of the output buffer determines the settling time of the CSA.

4. The CSA according to claim 2, wherein the sample-and-hold circuit prevents a current that is fed back from the output of the CSA to the input of the CSA from reaching the output buffer when the load is coupled to the CSA.

5. The CSA according to claim 1, wherein the CSA is implemented as a differential current-feedback instrumentation amplifier that provides isolation between input and output common mode levels.

6. The CSA according to claim 1, wherein the CSA has a multi-cascaded gain topology comprising a Miller capacitor or a Nested-Miller capacitance to reduce oscillations.

7. The CSA according to claim 6, wherein the Miller capacitor or the Nested-Miller capacitance separates frequencies of poles of the feedback network to increase circuit stability.

8. The CSA according to claim 6, wherein the sample-and-hold circuit comprises an inter-stage switch that, in a settling phase, enables a feedback path between an input stage and an output stage to allow an output voltage to settle.

9. The CSA according to claim 1, wherein the sample-and-hold circuit is integrated with the amplifier.

10. A method for operating a current sense amplifier (CSA), the method comprising:
in a settling phase, operating a CSA circuit comprising a feedback path to allow for a closed loop settling time to pass to settle, at an output node, an output voltage;
in a sample and hold phase, breaking the feedback path and operating the CSA in an open loop configuration;
holding the output voltage using a sample and hold circuit;
coupling a load to the output node; and allowing for an open loop settling time to pass to reduce a sensitivity to changes in an input or an output of the CSA, the open loop settling time being shorter than the closed settling time.

11. The method according to claim 10, comprising decreasing a settling time of the CSA by using a non-bandwidth-limiting output buffer to drive a load to a settled value regardless of an input of the CSA.

12. The method according to claim 11, comprising preventing a current fed back from an output to the input of the CSA from reaching the output when the load is coupled to the CSA.

13. The method according to claim 10, wherein the CSA is implemented as a differential current-feedback instrumentation amplifier that provides isolation between input and output common mode levels.

14. The method according to claim 10, comprising reducing oscillations by separating frequencies of poles of the feedback network using a Miller capacitor or a Nested-Miller capacitance.

15. The method according to claim 10, comprising, in a settling phase, enabling a feedback path between an input stage and an output stage to allow a CSA output voltage to settle.

16. A current sense amplifier (CSA) circuit comprising:
   a battery stack comprising battery cells;
   a sensing resistor couple to the battery stack;
   a CSA coupled the sensing resistor, the current sense amplifier comprising:
      an amplifier coupled to an input of the CSA;
      an output buffer coupled to the amplifier;
      an output switch coupled to the output buffer, the output switch configured to couple to a load;
      a sample-and-hold circuit coupled to the amplifier and the output buffer, the sample-and-hold circuit configured to hold an input voltage of the output buffer; and
      a feedback loop comprising a feedback network coupled to the output buffer, the feedback loop being broken in a sample and hold phase so as to operate the CSA in an open loop configuration to reduce a sensitivity to changes in an input or an output of the CSA; and
   a multiplexer coupled to the current sense amplifier.

17. The CSA circuit according to claim 16, wherein the output buffer does not bandwidth restrict and drives a load to a settled value regardless of the input of the CSA, and wherein an open loop gain of the output buffer determines the settling time of the CSA.

18. The CSA circuit according to claim 17, wherein the sample-and-hold circuit prevents a current that is fed back from the output of the CSA to the input of the CSA from reaching the output buffer when the load is coupled to the CSA.

19. The CSA circuit according to claim 16, wherein the CSA has a multi-cascaded gain topology comprising a Miller capacitor or a Nested-Miller capacitance to reduce oscillations and separate frequencies of poles of the feedback network.

20. The CSA circuit according to claim 16, wherein the sample-and-hold circuit comprises an inter-stage switch that, in a settling phase, enables a feedback path between an input stage and an output stage to allow an output voltage of the CSA to settle.

\* \* \* \* \*